Aug. 18, 1970 R. A. MAGEE ET AL 3,525,066

ELECTRICAL CONTACT PINS AND METHOD OF MAKING SAME

Filed Jan. 12, 1968 2 Sheets-Sheet 2

ELECTRICAL CONTACT PINS AND METHOD OF MAKING SAME

Filed Jan. 12, 1968 2 Sheets-Sheet 1

INVENTORS
ROBERT A. MAGEE
JOSEPH S. SCIOSCIA
BY [signature]
ATTORNEY

1

3,525,066

ELECTRICAL CONTACT PINS AND METHOD OF MAKING SAME

Robert A. Magee, Poughkeepsie, and Joseph S. Scioscia, Yorktown Heights, N.Y., assignors to International Business Machines Corporation, Armonk, N.Y., a corporation of New York Filed Jan. 12, 1968, Ser. No. 697,379
Int. Cl. H01r 9/16
U.S. Cl. 339—17 6 Claims

ABSTRACT OF THE DISCLOSURE

Selectively gold-plated electrical contact pins are mounted in multiple layer printed circuit boards. The gold plating at regions to be soldered to the board is thinner than at contact regions to prevent excessive tin-gold union and resultant solder joint contamination. Also, a process of fabricating the pins including applying a resinous based substance thereon and forming a plating resistive mask at preselected regions, electroplating gold thereon, and thereafter removing the mask and replating.

BACKGROUND OF THE INVENTION

This invention relates generally to electrical contact pins and methods of making same, and more particularly to gold coated contact pins that are mounted in interconnecting or printed circuit boards having electrical circuits printed or otherwise defined thereon.

It is often desirable that contact pins that are mounted in printed circuit interconnection boards be coated with a precious metal such as gold. The gold coating or covering assures good electrical contact and reliability, while preventing corrosion or oxidation of the pin core, which is generally nickel or the like. Such pins are used, for example, for facilitating external connection of small cards to a large board or card. These pins usually extend through the large board and make electrical connection with internal electrical planes therein. One or both ends of the pins will normally protrude from the larger board either to serve as the male portion of a connector, or to facilitate the making of electrical connections between the internal electrical planes of the larger board.

This approach is exemplified in the McConnell et al. U.S. Pat. No. 3,253,246, issued May 24, 1966 and assigned to the present assignee. In this patent, it will be seen that the contact pins extend through selected plated through holes in a printed circuit board and are soldered to the plated through holes. This soldering is necessary to connect the pins to the board. Since the usual solder contains some amount of tin, and since tin units with gold to some extent, it has been found that discontinuities and resulting structural weaknesses are created in the solder joints. This has not been a serious problem, however, in printed circuit boards of the type exhibited in the McConnell et al. patent since the joints were strong enough to hold the pins in the boards.

It is presently desirable to use multiple layer printed circuit or interconnection boards when practicable, as such boards provided higher circuit densities and therefore higher speed circuits. The plated through hole and gold covered contact pin approach was used heretofore when producing multiple layer circuit boards. However, it has been found that in this case, discontinuities and structural weaknesses in the solder joints constitute a serious problem. Due to the multiple layer construction, there may be diffierential thermal expansions under normal operating conditions, and weakened solder joints may fail. Of course, this is extremely undesirable as the boards may have to be discarded.

2

SUMMARY OF THE INVENTION

In one form of the present invention, gold-coated electrical contact pins are provided. These pins have a gold layer of a predetermined thickness on certain regions for making electrical contact with other components and a gold layer of another predetermined thickness on other regions to facilitate the soldering of the pin to a printed circuit or interconnection board. The gold layer at the other region is thin enough to prevent excessive gold-tin union and thereby prevents excessive discontinuities or contamination of the solder joint formed between the pin and board. This pin is especially useful in multiple layer printed circuit boards wherein the solder joints are subjected to considerable stress and the solder joints, if contaminated, may crack or fail and render the board unusable.

In another aspect of the present invention, in one form, selectively gold-coated contact pins are produced by masking certain regions thereof, applying a gold coating to preselected regions, removing the mask and applying the gold coating over the entire pin. In the preferred embodiment, the masking is accomplished by applying a phenolic resin based substance to the pin and curing the substance to form a plating resistive or electrically insulative barrier on the pin. The application of gold in the preferred embodiment is accomplished by electroplating, with the resistive barrier effectively preventing the gold from becoming plated on the pin. With the mask removed, the pin is plated again. This process enables selectively gold coated electrical contact pins to be produced at relatively low cost and with a great degree of accuracy and uniformity from pin to pin.

It is a general object of the present invention to provide gold-coated electrical contact pins that can be mounted on multiple layer circuit boards and methods of fabricating such pins.

It is another object of the present invention to provide gold plated electrical contact pins that are relatively inexpensive and that can be soldered in place in printed circuit boards without undue gold-solder union at the solder joint area, and methods of fabricating such pins.

It is another object of the present invention to provide multiple layer circuit boards or assemblies that exhibit increased structural reliability.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
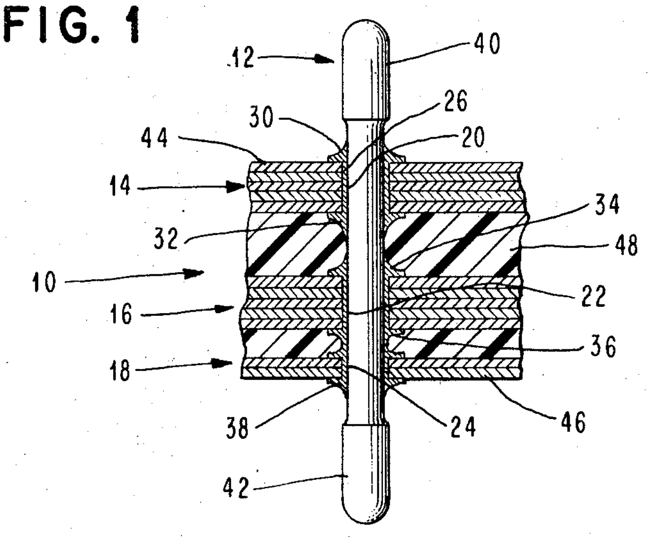
FIG. 1 is a partial sectional view of a multiple layer printed circuit board showing an electrical contact pin of the present invention soldered in place therein with the gold coating of the pin greatly exaggerated for purposes of better illustrating the invention.

There is illustrated, in FIG. 1, a multiple layer printed circuit or interconnection board 10 in vertical cross section with an electrical contact pin 12 of the present invention mounted in place therein in its usual manner. The board 10 is of generally the same type as illustrated in the U.S. Pat. of Poch et al., No. 3,312,878, issued Apr. 4, 1967, and assigned to the present assignee. The board 10 is a composite board made up, in the present instance, of three independently manufactured multilayer board sections 14, 16 and 18 superimposed upon one another and mounted spaced from one another on a plurality of contact pins such as the pin 12. Each section preferably has two surface signal wiring planes and one or more internal ground and voltage distribution planes. It will be appreciated, as pointed out in the aforementioned Poch et al. patent, that the number of sections and the makeup of each section is chosen to provide the required wiring density for connection to the various circuits of pirnted circuit cards (not illustrated herein). If desired, the spaces between the board sections can be filled with a suitable material such as epoxy 48. Reference should be made to the Poch et al. patent for further details of the board 10 and printed circuit cards.

Each of the board sections 14, 16 and 18 has a plurality of aligned plated through holes, such as the through holes 20, 22 and 24 shown in FIG. 1. These through holes are generally similar to, and are described in greater detail in the aforementioned McConnell et al. and Poch et al. patents, which are incorporated by reference herein. As shown in FIG. 1, the plated through holes 20, 22 and 24 each have a layer 26 of copper plated therethrough, that may be overplated with tin-lead or the like, if so desired. The pins 12 extend through the aligned through holes 20, 22 and 24 and are soldered in place therein in order to maintain the board sections in their respective positions, as well as to retain the pins in the board 10. As described in greater detail in the McConnell et al. patent, the pins 12 are soldered in place by dropping a solder ring over the end of the pins and heating in an oven or dipping into hot oil at temperatures in the vicinity of 390° Fahrenheit for approximately four and a half minutes. This soldering creates fillets or joints of solder between each pin 12 and its respective plated through hole or board section. In FIG. 1, the fillets or joints are denoted by reference numerals 30, 32, 34, 36 and 38, respectively, from the top of the board 10 to the bottom. When soldered in place in the board 10, the outer ends 40 and 42 of the pins 12 project beyond the faces 44 and 46 of the board 10, respectively. One end of the pins, for example end 40, is available to serve as the male portion of a card connector, and the other ends 42 may be reformed or squared up as by swagging and are available for external pin-to-pin wring, engineering changes, field repairs or special wiring as needed.

Figure 3:
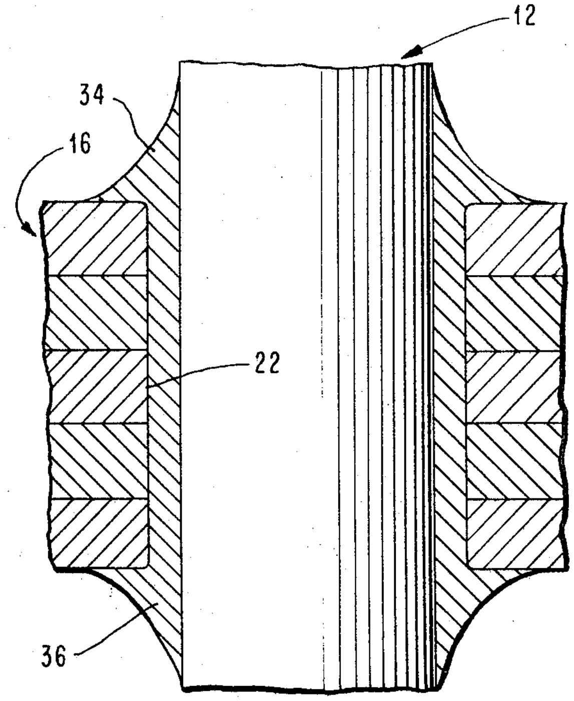
PRIOR ART FIG. 3
FIG. 3 is a similar photomicrograph cross section showing the solder joint between a pin of the present invention and its board wherein the solder joint is not subject to the defects present in the prior art.

As will be appreciated, the composite board 10 has more inherent stiffness than a single laminate. However, as will also be appreciated, due to the multiple layer or section configuration, differential thermal expansion may often occur during various manufacturing steps as well as during circuit operation, thereby subjecting the solder joints or fillets to severe mechanical loads. Therefore, it is extremely important that the solder joints be homogeneous and free from contamination. As shown in FIG. 3, the five solder joints 30, 32, 34, 36 and 38 are regular and generally homogeneous since they are formed on a pin provided in accordance with the present invention. In this figure, a photomicrograph section of solder joints 34 and 36 between a pin 12 and a board section 16 is illustrated, without plating in the through hole 22. FIG. 3 shows the solder joints 34 and 36 as uniform and homogeneous.

In contra-distinction to the homogeneous joints 34 and

Figure 2:
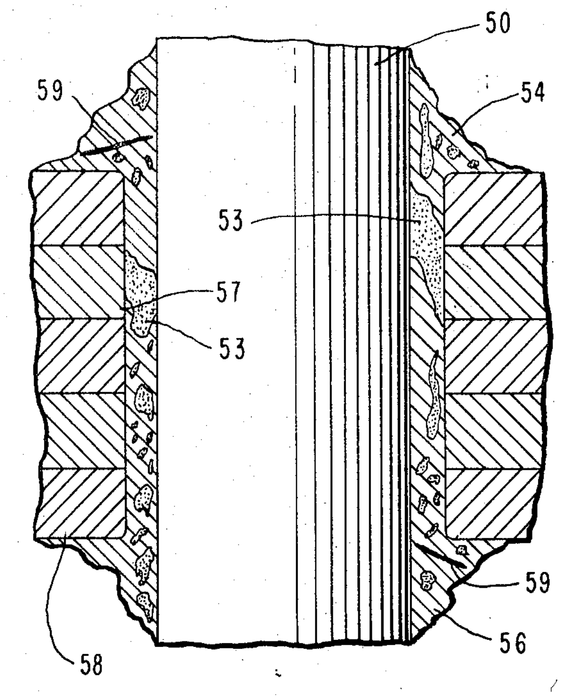
FIG. 2 is a photomicrograph cross section showing the solder joint between a prior art pin and its board wherein the joint exhibits excessive contamination.

36 shown in FIG. 3, reference should be made now to FIG. 2. In FIG. 2, typical solder joints 54 and 56 that occur when prior art contact pins 50 are soldered into a through hole 57 in a circuit board 58 are shown in microphotograph section. The pin 50 is a typical prior art pin, having a uniform gold coating thereon of approximately 75–150 millionths of an inch thickness. The gold coating on such prior art pins was usually in this range as 75 millionths of an inch is the minimum thickness of gold required on the ends of the pins in order to insure good electrical contact and continuous covering in the contact area. As will be noted by referring to FIG. 2, however, gold of this thickness at a solder joint region results in non-homogeneous or "contaminated" joints 54 and 56. Again, for purposes of illustration, there is no plating in the through hole 57 as would normally be the case. The solder joints 54 and 56 are considered to be atypical, having innumerable voids or discontinuities 53 and elongated crystalline structures or formations 59 therein. These joints are typically porous, erratic in outline and generally unsatisfactory, in that stresses thereon often result in the joints cracking. The crystalline structures 59 result as the gold is dissolved by the tin in the solder, forming a tin-gold alloy that solidifies sooner than the solder during reflow. These crystalline structures 59 are quite brittle, and form lines of weakness throughout the solder joints. In addition, the alloy formed by the tin and gold has a higher melting point and is not homogeneous with the solder, resulting in non-wettability and coatability due to high surface tensions that occur. Solder joints such as illustrated in FIG. 2, if occurring in a composite board such as the board 10 illustrated in FIG. 1, experience a high rate of failure due to cracking. In addition, it is very difficult to control fillet height, and for the outer joints (e.g., such as joints 30 and 38 in FIG. 1) the solder often will wick upwardly onto the contact portions 40 and 42 of the pins, which is, of course, undesirable.

It will be understood that the pin 50 illustrated in FIG. 2 is a conventional gold-plated contact pin having a uniform coating of "heavy" gold thereon. It is meant by "heavy" gold coating, that the thickness of the gold coating is at least 75 millionths of an inch which, as explained above, is required to insure good electrical contact. However it has been found that at this thickness of gold, the tin-gold union is greater than can be tolerated and the solder joint is "contaminated." As a matter of fact, it was unexpectedly found that unless the tin-gold union is kept below approximately five percent at the region of the pin to be soldered, the joint will be contaminated, i.e., five percent by weight of gold with respect to so-called 60–40 solder, or solder having 40 parts of lead to 60 parts of tin by weight. We have found that is was necessary to have a gold covering of less than 25 millionths of an inch thickness to maintain tin-gold union below five percent.

Figure 7:
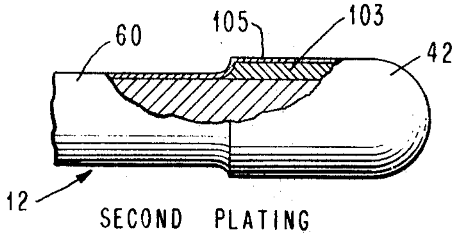

In order to eliminate the problem of solder joint contamination outlined above, we provided the specific electrical contact pin 12 shown best in FIGS. 1 and 7. As seen in FIG. 7, for example, the end portions 40 and 42 of the pin have a "heavy" coating of gold thereon, and other preselected regions of the pin, e.g., the center region 60, have a "thin" surface coating of gold, i.e., less than 25 millionths of an inch in thickness (exaggerated, of course, in the drawing for purposes of illustration). This thin coating of gold is necessary to retard corrosion of the pin base metal, while keeping the gold-tin union at or below approximately five percent. Additionally, the thin gold coating acts as an active pre-solder flux, eliminating the need for such as an additional step in the manufacture of the board. In this latter regard, the thin gold covering serves an important function inasmuch as the known active fluxes, that would be necessary to prepare the nickel pin for soldering were the gold not present, have deleterious effects on the board materials, particularly copper.

It will be seen in FIG. 7 that the gold coating at region 60 is generally continuous with the outer gold coating at regions 40 and 42. In the exemplification, the gold coating on the pin was applied by electroplating in accordance with the method illustrated in FIGS. 4–8, and the actual gold coating thicknesses on the center region 60 and the end regions 40 and 42 was respectively 15±10 millionths of an inch and 150±25 millionths of an inch.

With reference now to FIGS. 4–8, a preferred method of fabricating the pins 12 in accordance with the present invention is illustrated. The prepared method includes depositing a plurality of bare nickel electrical contact pins as generally denoted by reference numeral 72 in a vibratory feeder 74. Vibratory feeders such as the type 74 are well known to those skilled in the art. The pins are fed from the feeder 74 in a chute 76 wherein they are oriented and fed in the direction of their longitudinal axis into a transfer device 78. The transfer device 78 includes an inclined runway 80 wherein pins are continuously fed in a direction at right angles to their longitudinal axis into retaining slots 82 in a rotatable wheel 84. The wheel 84 is supported by suitable supporting means 86 and rotated in the direction indicated by arrow 88 by some suitable type of drive means (not illustrated). It will be seen that the pins are fed by gravity into the slots 82 and, as the wheel 84 rotates, the pins are moved adjacent an inking wheel 90. The inking wheel 90 is driven in the direction indicated by arrow 92 by the drive wheel 94, and supplied with a masking substance, to be described more fully hereinafter, by suitable supply means (not illustrated). It will be appreciated that the inking wheel 90 and drive wheel 94 may comprise a portion of a conventional in-line offset printer, such as that described in U.S. Pats. 3,125,949, issued Mar. 24, 1964, and 3,146,699, issued Sept. 1, 1964. The printing wheel 90 is selected to be of a width substantially equal to the width of the center region 60 of the pin.

Figure 8:
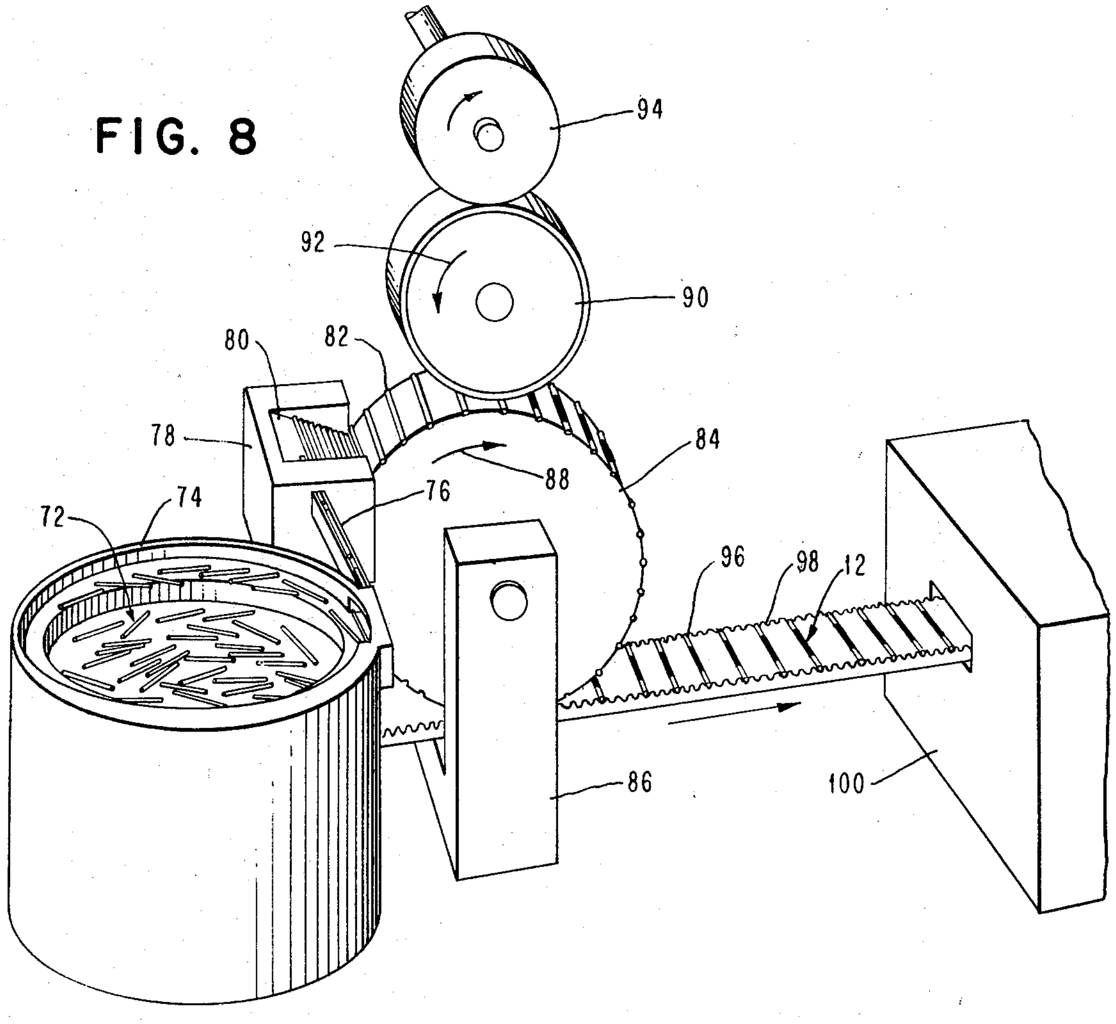
FIG. 8 is a simplified perspective view of a preferred form of appartaus useful for fabricating electrical contact pins in accordance with the process of the present invention.

The apparatus illustrated in FIG. 8 is utilized to apply an electrodeposition mask or electrically insulative coating to the preselected region 60 of the pins as the pins rotate under the printing wheel 90. The wheel 84 then continues its rotation and the coated pins fall into retaining slots 96 in an in-line conveyor 98 wherein they are coveyed to an oven 100 for curing. The conveyor 98, of course, is a continuous belt type conveyor, but only a part thereof is shown to simplify the drawings. The oven 100, shown schematically herein, is in practice an induction heating generator, used as it dries from the inside out, driving out solvents and reducing the tendency for blisters to form. This method of curing is most desirable as it results in a superior bonding of the masking substance to the pins, but as will be understood, other curing techniques would be acceptable.

The substance to be applied to the pins at the region 60 necessarily must have certain required characteristics that enable it to be applied evenly onto the pins and to be cured to form a suitable electrodeposiiton mask. By way of example, the substance must, when cured, from a good electrical insulator and must adhere well to metallic surfaces without having surface defects such as pin holes or blisters. Furthermore, the substance must possess chemical resistance to acidity, since the pins are cleaned in acidic baths, and also are subjected to an acidic electroplating bath after the mask is formed. The substance must also be capable of being applied in an even stripe of controllable width and, when cured, be easily removable by a suitable inexpensive solvent. It is also desirable that the substance have a pot life that enables it to be transferred from the inking wheel 90 onto the pins without partially polymerizing or otherwise degrading, or what commonly is known as "drying."

The above-mentioned characteristics are present in a commercially available printing ink known in the trade as "M–145" printing ink, manufactured by James H. Matthews & Co. of Pittsburgh, Pa. The "M–145" ink is a phenol-formaldehyde based substance in a usual solvent base that normally has pigment applied thereto for use as a printing ink. The pigment in the ink, when it is to be used for the present purpose (i.e., to form a plating resistive mask or electrical insulator) must, of course, be nonconductive. It will be appreciated that the above printing ink is effective for use as a masking agent since its flow characteristics permit it to be evenly applied to the pins 12 in the manner described above and that, when cured, it adheres well to the metallic pins and is electrically insulative in character. It should be understood, however, that this substance is given merely by way of illustrating one type of masking substance that is commercially available. Other suitable substances that have the above-described characteristics might also be used in the practice of the present invention.

Figure 4:
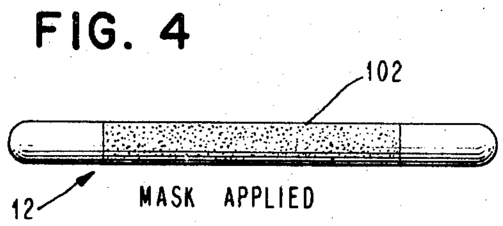
FIGS. 4–7, inclusive, are elevational views showing an electrical contact pin in various stages of manufacture in accordance with the present invention.
Figure 5:
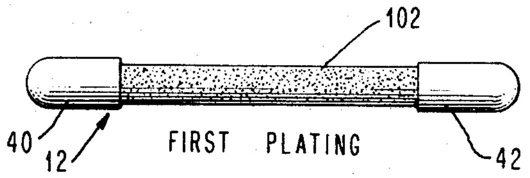
Figure 6:
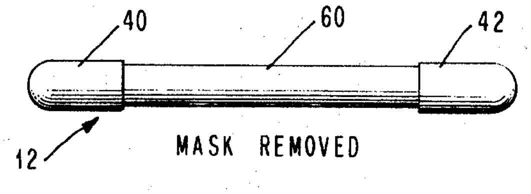

Referring now to FIGS. 4–7, we have illustrated an electrical contact pin in various stages of manufacture in accordance with the present invention. FIG. 4 shows a bare nickel pin that has had a stripe of "M–145" ink applied thereto as center region 60 and cured to form a plating resistive mask 102. The mask 102, in this case, was formed as explained above in conjunction with the apparatus illustrated in FIG. 8. With the mask 102 applied precisely on the region to be protected from a gold electroplating bath, i.e., region 60, the pin 12 is subjected to a conventional gold-plating bath wherein a first plated layer of gold 103 adheres to the end regions 40 and 42 as shown in FIGS. 5 and 7. In practice, of course, a number of pins 12 are plated at one time, and we have found the well-known "barrel" plating technique to be useful in this regard. While the end regions 40 and 42 are covered with the first layer of gold 103, gold does not adhere to the preselected region 60 as it is covered by mask 102. At this time, the mask 102 is removed from pin 12 by a suitable chemical solvent such as hot sodium hydroxide, resulting in the condition of pin 12 as shown in FIG. 6. The preselected region 60 under the mask 102 is, of course, bare nickel, while the end regions 40 and 42 are gold plated. At this time, the pin, in the condition shown in FIG. 6, is subjected to a second plating bath wherein a thin overcoat of gold 105 is applied to both the end portions 40 and 42 and the center region 60 receives a thin layer of gold. The pin 12 is now completed and ready for installation in an interconnection board such as the board 10.

The completed, or selectively gold-plated, pin 12 is attractive for reasons other than that the thin gold-plated region 60 permits reliable solder joints to be effected between the pin and interconnection board. For example, we have found that the fillet height of solder joints 30 and 38 (FIG. 1) can be controlled, preventing creep or wicking of solder onto the contact end regions 40 and 42. Thus, during reflow, the solder will stop wicking as soon as it meets the heavy gold covering the adjacent contact regions (40 or 42). This happens as the tin-gold alloy is formed when the molten solder meets the heavy gold, and the heavy gold forms, in effect, a barrier to wicking, providing a uniform fillet height on each pin. Further, there is substantial saving in gold on each pin produced in accordance with the present invention, as the region 60 comprises nearly sixty percent of the pin length and the gold coating is reduced by a factor of six (i.e., 25 millionths rather than 150 millionths in region 60, as in the prior art pins).

While we have described the preferred method for producing the selectively gold-plated pins of this invention, it will be understood that the pins may be produced in other manners. For example, rather than produce the mask 102 on the bare pin, as explained above, prior to the first heavy plating, a first, thin plating could be applied and thereafter the mask would be produced. The second plating would, in such case, then be a heavier plating than previously, to provide the "heavy" coated contact regions 40 and 42. While the use of an offset printing apparatus shown in FIG. 8 is particularly desirable since the dimensions of the pre-masking stripe can be carefully controlled, the phenolic resin substance may, if desired, be applied to the pins in other manners, or other suitable electrically insulative materials may be used to provide the mask on the pins.

While the invention has been particularly shown and described with reference to preferred embodiments thereof, it will be understood by those skilled in the art that various changes in form and detail may be made therein without departing from the spirit and scope of the invention.

What is claimed is:

1. An electrical contact pin mounted in a multiple layer circuit board having a plurality of conductive planes with holes extending through at least several of the planes, with said pin lying within the holes and connected to the board by at least one solder joint, said pin comprising:

an elongate pin base of electrically conductive metal, at least one end region of the pin base having a gold coating of at least seventy-five millionths of an inch thickness, said at least one end region being adapted to extend beyond one surface of the board for facilitating the making of electrical connections thereto; and at least a preselected region of the pin base having a gold coating less than twenty-five millionths of an inch in thickness, said preselected region being soldered to the board wherein a solder joint formed between the pin and the board will be relatively free from discontinuities and other faults.

2. An electrical contact pin for mounting in a multiple layer circuit board having a plurality of conductive planes with holes extending through at least several of the planes, with said pin being adapted to lie within the holes and to be connected to the board by at least one solder joint, said pin comprising:

an elongate pin base of electrically conductive metal, at least one end region of the pin base having a gold coating of at least seventy-five millionths of an inch thickness, said at least one end region being adapted to extend beyond one surface of the board for facilitating the making of electrical connections thereto;

at least a preselected region of the pin base having a gold coating less than twenty-five millionths of an inch in thickness, said preselected region being adapted to be soldered to the board wherein a solder joint formed between the pin and the board will be relatively free from discontinuities and other faults, and wherein each end region of said pin is adapted to extend beyond the printed circuit in the connection board, with each end region having a gold coating of at least seventy-five millionths of an inch thickness, and said preselected region being between the ends of said pin.

3. An electrical contact pin connected in a multiple layer printed circuit board by means of a tin-base solder connection, said pin comprising:

an elongate base of electrically conductive metal;

a first preselected portion of said pin having a gold surface coating of sufficient thickness to provide a contact region; and a second preselected portion of said pin having a gold surface coating of a predetermined thickness that will prevent tin-gold union with said tin-base solder connection in excess of five percent, with the gold surface coating on said first and second preselected portions of said pin being substantially uninterrupted.

4. The electrical contact pin of claim 3 wherein the gold surface coatings on said first preselected portion and second preselected portion are gold-plated coatings.

5. A circuit interconnection board comprising a plurality of generally parallel sections each having a plurality of conductive planes, all of the sections having a plurality of plated through holes selectively making connection to predetermined of said planes, a plurality of electrical contact pins, said pins being soldered in place into selected of said plated through holes, said pins having a gold surface coating of a predetermined thickness on at least one region thereof and having a gold surface coating of a second predetermined thickness on at least another region thereof, and at least one solder joint connecting said at least another region to a plated through hole with the union of said gold and the tin in the solder being below a preselected level.

6. The circuit interconnection board of claim 5 wherein the gold surface coating on said at least one region is at least seventy-five millionths of an inch, and wherein the gold surface coating on said at least another region is less than twenty-five millions of an inch.

References Cited

UNITED STATES PATENTS

| | | | |
|---|---|---|---|
| 2,907,925 | 10/1959 | Parsons | 174—68.5 X |
| 2,988,665 | 6/1961 | Duran et al. | 339—278 X |
| 3,208,030 | 9/1965 | Evans et al. | 339—278 X |
| 3,371,249 | 2/1968 | Prohofsky | 339—17 X |

OTHER REFERENCES

Publication, Engineering Report, "New Plating Technique Developed" by Roy White, Cinch Mfg. Co. (Cinch Contact Catalog, page 5) 1965.

RICHARD E. MOORE, Primary Examiner

U.S. Cl. X.R.

339—275, 278